US010627057B2

(12) United States Patent
Mizobe

(10) Patent No.: US 10,627,057 B2
(45) Date of Patent: Apr. 21, 2020

(54) LAMP

(71) Applicant: NEC LIGHTING, LTD., Tokyo (JP)

(72) Inventor: Norimasa Mizobe, Tokyo (JP)

(73) Assignee: HotaluX, Ltd., Tokyo (JP)

(*) Notice: Subject to any disclaimer, the term of this patent is extended or adjusted under 35 U.S.C. 154(b) by 0 days.

(21) Appl. No.: 15/775,041

(22) PCT Filed: Oct. 18, 2016

(86) PCT No.: PCT/JP2016/080851
§ 371 (c)(1),
(2) Date: May 10, 2018

(87) PCT Pub. No.: WO2017/081999
PCT Pub. Date: May 18, 2017

(65) Prior Publication Data
US 2018/0328550 A1 Nov. 15, 2018

(30) Foreign Application Priority Data

Nov. 11, 2015 (JP) .................................. 2015-221045

(51) Int. Cl.
F21S 45/48 (2018.01)
F21S 45/60 (2018.01)
(Continued)

(52) U.S. Cl.
CPC ................ *F21S 2/005* (2013.01); *B64F 1/20* (2013.01); *F21V 29/51* (2015.01); *F21V 29/71* (2015.01);
(Continued)

(58) Field of Classification Search
CPC .......... F21V 29/51; F21V 29/71; F21V 29/90; F21S 45/47; F21S 45/48; F21S 45/60
(Continued)

(56) References Cited

U.S. PATENT DOCUMENTS 8,899,803 B2 * 12/2014 Marley .................. F21S 48/115
362/516
2006/0104077 A1 * 5/2006 Oshio .................. B60Q 1/0005
362/547
(Continued)

FOREIGN PATENT DOCUMENTS

JP 2004-308296 A 11/2004
JP 2006-156287 A 6/2006
(Continued)

OTHER PUBLICATIONS

International Search Report for PCT/JP2016/080851 dated Jan. 10, 2018 [PCT/ISA/210].

*Primary Examiner* — Christopher M Raabe
(74) *Attorney, Agent, or Firm* — Sughrue Mion, PLLC

(57) ABSTRACT

Provided is a lamp with an LED that can prevent snow from sticking or snow melted thereon from freezing. A lamp (10) includes: an LED module (11) serving as a light source; a heatsink (12); a heat transfer unit (13); a light distribution unit (14); a housing (15) with an opening; and a light-transmissive cover (16). The LED module (11) includes a plurality of LEDs, and an LED substrate having a mounting surface on which the plurality of LEDs are mounted. The heatsink (12) is arranged on the side of the LED substrate opposite to the mounting surface. The light distribution unit (14) is arranged on the light emitting side of the LED module (11). The LED module (11), the heatsink (12), and the light distribution unit (14) are arranged in the housing (15). The light-transmissive cover (16) is arranged in the opening of the housing (15). The heat transfer unit (13) includes a heat conduction section (13a) and a heat discharge section (13b), the heat conduction section (13a) being arranged so as to conduct heat from the heatsink (12), and the heat discharge section (13b) being arranged so as to (Continued)

be able to discharge the heat to the light-transmissive cover (16).

9 Claims, 5 Drawing Sheets

(51) Int. Cl.
*F21S 2/00* (2016.01)
*F21V 29/51* (2015.01)
*F21V 29/90* (2015.01)
*H01L 33/64* (2010.01)
*B64F 1/20* (2006.01)
*F21V 29/71* (2015.01)
*H01L 33/60* (2010.01)
*F21W 111/06* (2006.01)
*F21Y 115/10* (2016.01)
*F21V 7/00* (2006.01)

(52) U.S. Cl.
CPC ............ *F21V 29/90* (2015.01); *H01L 33/642* (2013.01); *F21V 7/00* (2013.01); *F21W 2111/06* (2013.01); *F21Y 2115/10* (2016.08); *H01L 33/60* (2013.01); *H01L 33/648* (2013.01)

(58) Field of Classification Search
USPC .......................................................... 313/46
See application file for complete search history.

(56) References Cited

U.S. PATENT DOCUMENTS

| | | | | |
|---|---|---|---|---|
| 2006/0278803 | A1* | 12/2006 | Mochizuki | B29C 45/14336 248/538 |
| 2007/0181565 | A1* | 8/2007 | Murahashi | B60Q 1/0005 219/629 |
| 2009/0034231 | A1* | 2/2009 | Chu | F21V 29/004 362/92 |
| 2010/0315830 | A1* | 12/2010 | Wan | F21V 29/02 362/547 |
| 2011/0305025 | A1* | 12/2011 | Loveland | F21K 9/00 362/294 |
| 2013/0114279 | A1* | 5/2013 | Marley | F21S 48/115 362/516 |
| 2014/0184075 | A1* | 7/2014 | Ter-Hovhannissian | F21V 3/06 315/114 |
| 2015/0252996 | A1* | 9/2015 | Kadijk | F21V 3/04 315/309 |

FOREIGN PATENT DOCUMENTS

| | | |
|---|---|---|
| JP | 2008-112628 A | 5/2008 |
| JP | 2008-135260 A | 6/2008 |
| JP | 2009-147175 A | 7/2009 |
| JP | 2009-187707 A | 8/2009 |
| JP | 2010-182495 A | 8/2010 |
| JP | 2010-247576 A | 11/2010 |
| JP | 2013-175391 A | 9/2013 |
| JP | 2014-102881 A | 6/2014 |

* cited by examiner

LAMP

CROSS REFERENCE TO RELATED APPLICATIONS

This application is a National Stage of International Application No. PCT/JP2016/080851, filed on Oct. 18, 2016, which claims priority from Japanese Patent Application No. 2015-221045, filed on Nov. 11, 2015. The entire disclosure of this Japanese patent application is incorporated herein by reference.

TECHNICAL FIELD

The present invention relates to a lamp.

BACKGROUND ART

Conventionally, flashing devices with a xenon lamp are used to guide landing aircraft to runways at airports and the like (see Patent Documents 1 to 4).

CITATION LIST

Patent Documents

[Patent Document 1]: JP 2006-156287A
[Patent Document 2]: JP 2008-112628A
[Patent Document 3]: JP 2010-182495A
[Patent Document 4]: JP 2010-247576A

BRIEF SUMMARY OF THE INVENTION

Problem to be Solved by the Invention

If the above-descried xenon lamps are replaced with light-emitting diode (LED) lamps, it is possible to significantly extend the lifespan of the flashing devices, and to reduce power consumption thereof. However, LED lamps generate a small amount of heat when emitting light as compared to xenon lamps, and thus in, for example, cold weather regions such as Hokkaido or Alaska, snow may stick to a light-transmissive cover that covers the front of the lamp, or the snow that has stuck thereto may melt and then freeze, and the function as a flashing device may be impaired.

Accordingly, it is an object of the present invention to provide a lamp with an LED that can prevent snow from sticking thereto or snow melted thereon from freezing.

Means for Solving Problem

In order to achieve the above-described object, the lamp according to the present invention includes: an LED module serving as a light source; a heatsink; a heat transfer unit; a light distribution unit; a housing with an opening; and a light-transmissive cover. The LED module includes a plurality of LEDs, and an LED substrate having a mounting surface on which the plurality of LEDs are mounted. The heatsink is arranged on a side of the LED substrate opposite to the mounting surface. The light distribution unit is arranged on a light emitting side of the LED module. The LED module, the heatsink, and the light distribution unit are arranged in the housing. The light-transmissive cover is arranged in the opening of the housing. The heat transfer unit includes a heat conduction section and a heat discharge section, the heat conduction section being arranged so as to conduct heat from the heatsink, and the heat discharge section being arranged so as to be able to discharge the heat to the light-transmissive cover.

Effects of the Invention

According to the present invention, it is possible to provide a lamp with an LED that can prevent snow from sticking thereto or snow melted thereon from freezing.

MODE FOR CARRYING OUT THE INVENTION

Figure 1:
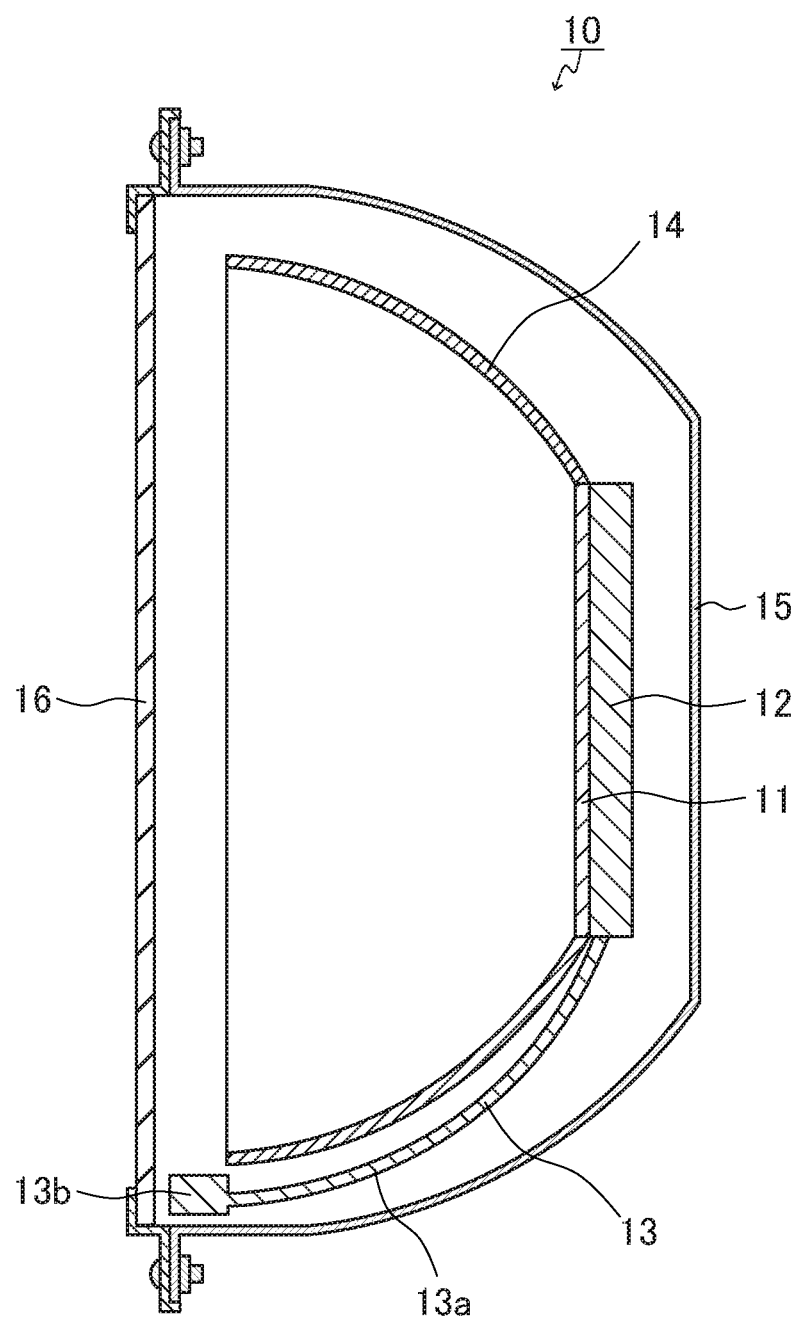
FIG. 1 is a cross-sectional view illustrating an example of a configuration of a lamp according to Embodiment 1.

Hereinafter, the lamp according to the present invention will be described in detail with reference to the drawings. However, the present invention is not limited to the description below. Note that in FIGS. 1 to 5 below, the same reference numerals are given to the same components, and descriptions thereof may be omitted. Also, in the drawings, for ease of description, the components may be shown with simplified structures, and may be shown in schematic dimensional ratios and the like, as opposed to the actual dimensional ratios and the like.

Embodiment 1

The present embodiment is an example of a lamp that is used in a flashing device for guiding landing of aircraft. FIG. 1 shows an example of a configuration of the lamp of the present embodiment. As shown in FIG. 1, a lamp 10 includes: an LED module 11, which serves as a light source; a heatsink 12; a heat transfer unit 13; a light distribution unit 14; a housing 15 with an opening; and a light-transmissive cover 16. In the lamp 10 shown in FIG. 1, the heat transfer unit 13 is a heat pipe, and the same applies to FIG. 2A. Note however that in the lamp of the present invention, the heat transfer unit may be of any type as long as it can transfer heat, and is not limited to a heat pipe. The light distribution unit 14 is a unit configured to transmit light generated by the LED module 11 to the light-transmissive cover 16 side using, for example, reflection, collection, diffusion, and the like. In the lamp 10 shown in FIG. 1, the light distribution unit 14 is a reflector, and the same applies to FIG. 2A. In the lamp of the present invention, the light distribution unit may also be a lens 14a as shown in, for example, FIG. 5. Furthermore, in the lamp of the present invention, both a reflector and a lens may be used as the light distribution unit. The LED module 11 includes a plurality of LEDs, and an LED substrate having a mounting surface (surface on the left side, in FIG. 1) on which the plurality of LEDs are mounted. The heatsink 12 is arranged on the side of the LED substrate opposite to the mounting surface (to the right of the LED module 11, in FIG. 1). The reflector 14 is arranged on a light emitting side of the LED module 11 (to the left of the mounting surface, in FIG. 1). The LED module 11, the heatsink 12, and the reflector 14 are arranged in the housing 15. The light-transmissive cover 16 is arranged in the opening of the housing 15. The heat pipe 13 includes a heat conduction section 13a and a heat discharge section 13b, and the heat conduction section 13a is arranged so as to conduct heat from the heatsink 12, and the heat discharge section 13b is arranged so as to be able to discharge the heat to the light-transmissive cover 16.

The LED module 11 may be provided with a plurality of LEDs mounted on the mounting surface of the LED substrate so that they have the same level of brightness as a xenon lamp used for a conventional flashing device for guiding landing of aircraft. The size and the material of the LED substrate, and the number of the LEDs and the like are not particularly limited.

The material of the heatsink 12 may be a metal, for example. Examples of the metal include aluminum and alloys thereof, magnesium and alloys thereof, iron and alloys thereof, copper and alloys thereof, and titanium and alloys thereof. Furthermore, the material of the heatsink 12 may also be, for example, a resin containing a high thermal conductive filler. Examples of the resin include polybutylene terephthalate (PBT), polyethylene terephthalate (PET), polycarbonate (PC), polyamide (PA), polyphenylene sulfide (PPS), and polymethyl methacrylate (PMMA). Furthermore, the material of the heatsink 12 may also be, for example, a composite material of graphite, carbon fiber or the like, and a metal such as aluminum or copper.

As shown in FIG. 1, the heat discharge section 13b of the heat pipe 13 is arranged on the light-transmissive cover 16 side, and one end of the heat conduction section 13a of the heat pipe 13 is preferably thermally connected to the heatsink 12. The heat pipe 13 may be a self-excited vibration type heat pipe. Also, a commercially available heat pipe may be used.

Examples of the material of the reflector 14 include: metals such as aluminum and alloys thereof and magnesium and alloys thereof; and resins such as PC and PBT. The reflector 14 may be, for example, a reflector that has a reflecting surface subjected to high reflection processing, such as plating or application of a highly reflective paint, to have an improved reflection efficiency. For example, in the lamp 10, the reflector 14 may be tubular as shown in FIG. 1, and the LED module 11 and the heatsink 12 may be arranged in one opening (on the right side in FIG. 1) of the reflector 14, so that the mounting surface of the LED module 11 is directed to the inside of the tube of the reflector 14. FIG. 1 shows an example of the reflector 14 (in the shape of an umbrella, for example) in which one opening area is smaller than the other opening area, but the areas of the two openings of the reflector 14 may be the same. Furthermore, the cross section of the reflector 14 may be arcuate as exemplified in FIG. 1, or linear.

Examples of the material of the housing 15 include aluminum and resins.

As shown in, for example, FIG. 1, in the lamp 10, the heat pipe 13 may be arranged between the reflector 14 and the housing 15, and the heat discharge section 13b of the heat pipe 13 may be arranged between the inner surface of the light-transmissive cover 16 and the opening, on the light emitting side (on the left side in FIG. 1), of the reflector 14.

Any material may be used as the material of the light-transmissive cover 16 as long as most rays of light emitted by the LED module 11 can pass therethrough. For example, glass or the like may be used.

In the lamp 10 of the present embodiment, the heat pipe 13 includes the heat conduction section 13a and the heat discharge section 13b, the heat conduction section 13a is arranged so as to conduct heat from the heatsink 12, and the heat discharge section 13b is arranged so as to be able to discharge heat to the light-transmissive cover 16. With this configuration, it is possible to prevent snow from sticking to the light-transmissive cover 16 or snow melted thereon from freezing. Furthermore, according to the lamp 10 of the present embodiment, there is no need to use, for example, a fan, which is a cause of concern for failure, to transfer heat of inside of the housing 15. This thus eliminates the need of performing maintenance on the inside of the housing 15 for about twenty to thirty years, which is the lifespan of the LEDs, for example.

As shown in FIG. 1, the heat discharge section 13b is preferably arranged on the lower side of the lamp 10 when it is arranged in a vertical direction. In this case, using, for example, the principle that hot air moves upward from the lower side, it is possible to effectively transfer heat discharged from the heat discharge section 13b to the light-transmissive cover 16, and to cause a one-directional convective flow of the heat within the housing 15. Note however that the heat discharge section 13b may also be arranged on the upper side of the lamp 10 when it is arranged in the vertical direction, or may also be arranged at a position between the lower side and the upper side of the lamp 10. Furthermore, the lamp 10 may also include a plurality of heat pipes 13 and heat discharge sections 13b.

Figure 3:
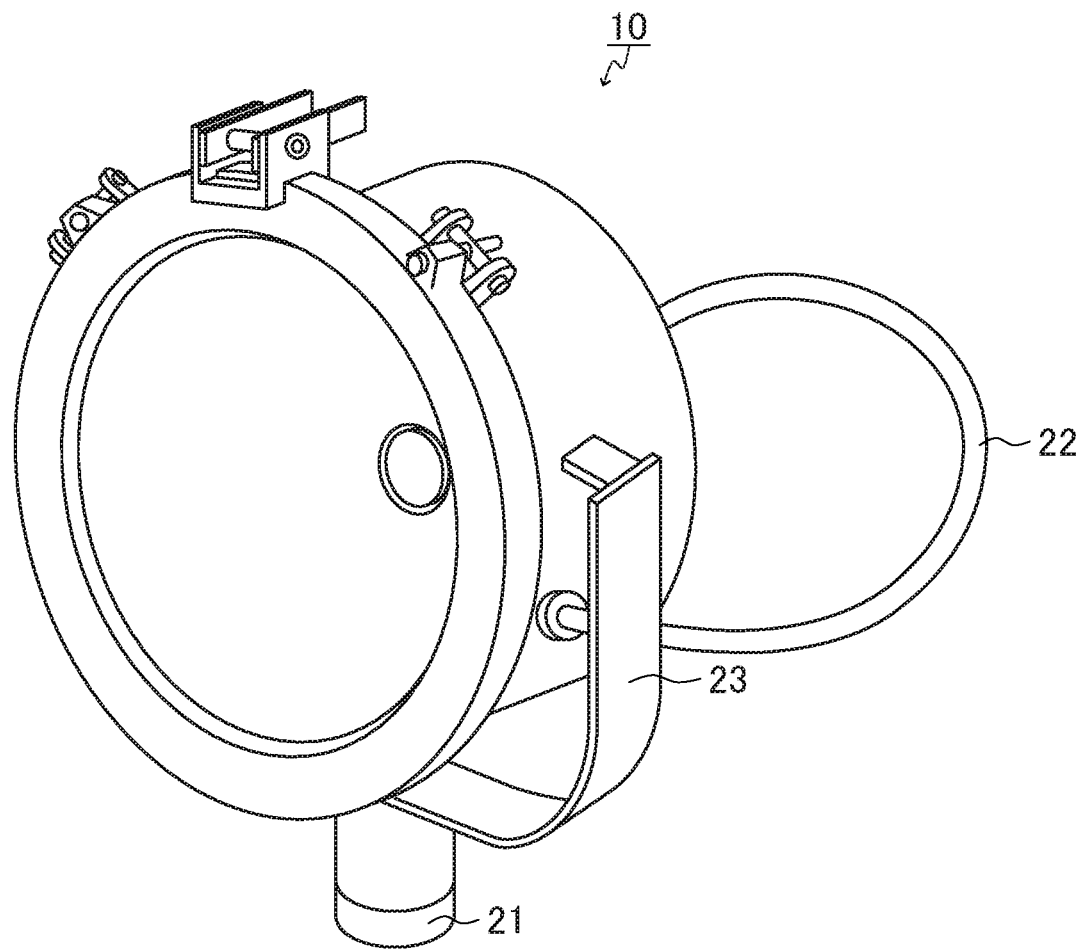
FIG. 3 is a perspective view illustrating an example of an arrangement of the lamp according to Embodiment 1.
Figure 4:
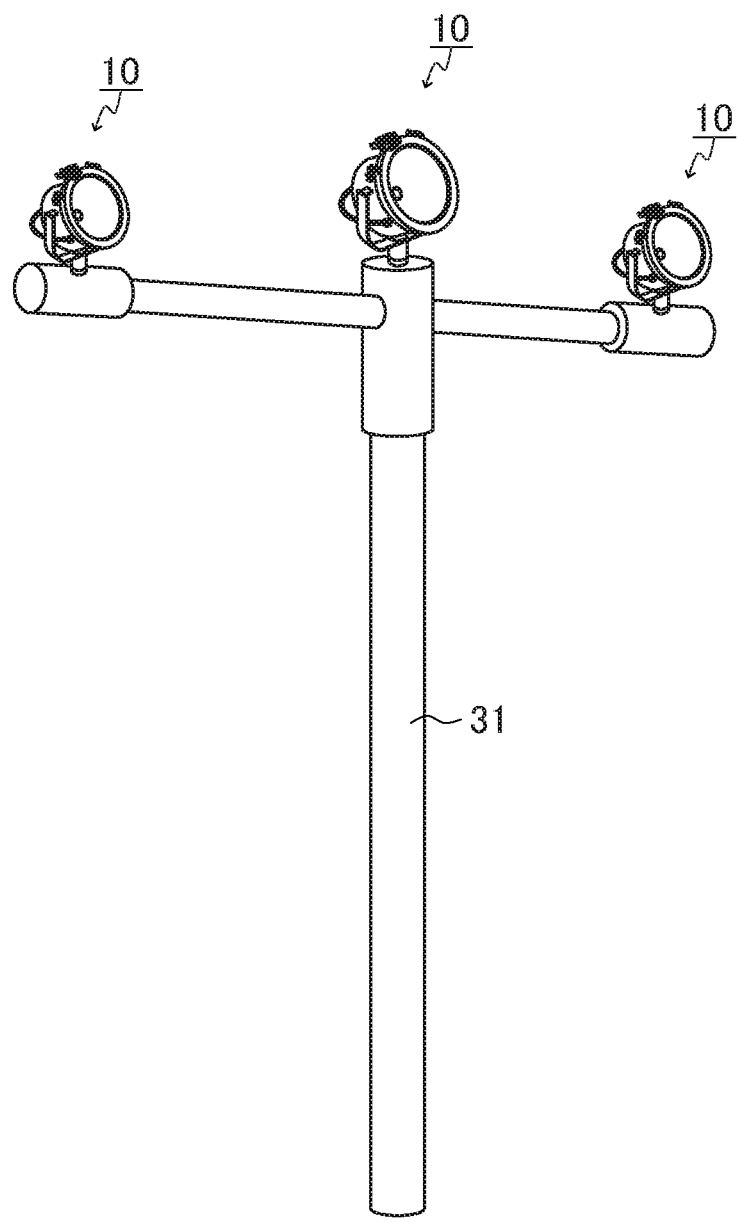
FIG. 4 is a perspective view illustrating another example of an arrangement of the lamps according to Embodiment 1.
Figure 5:
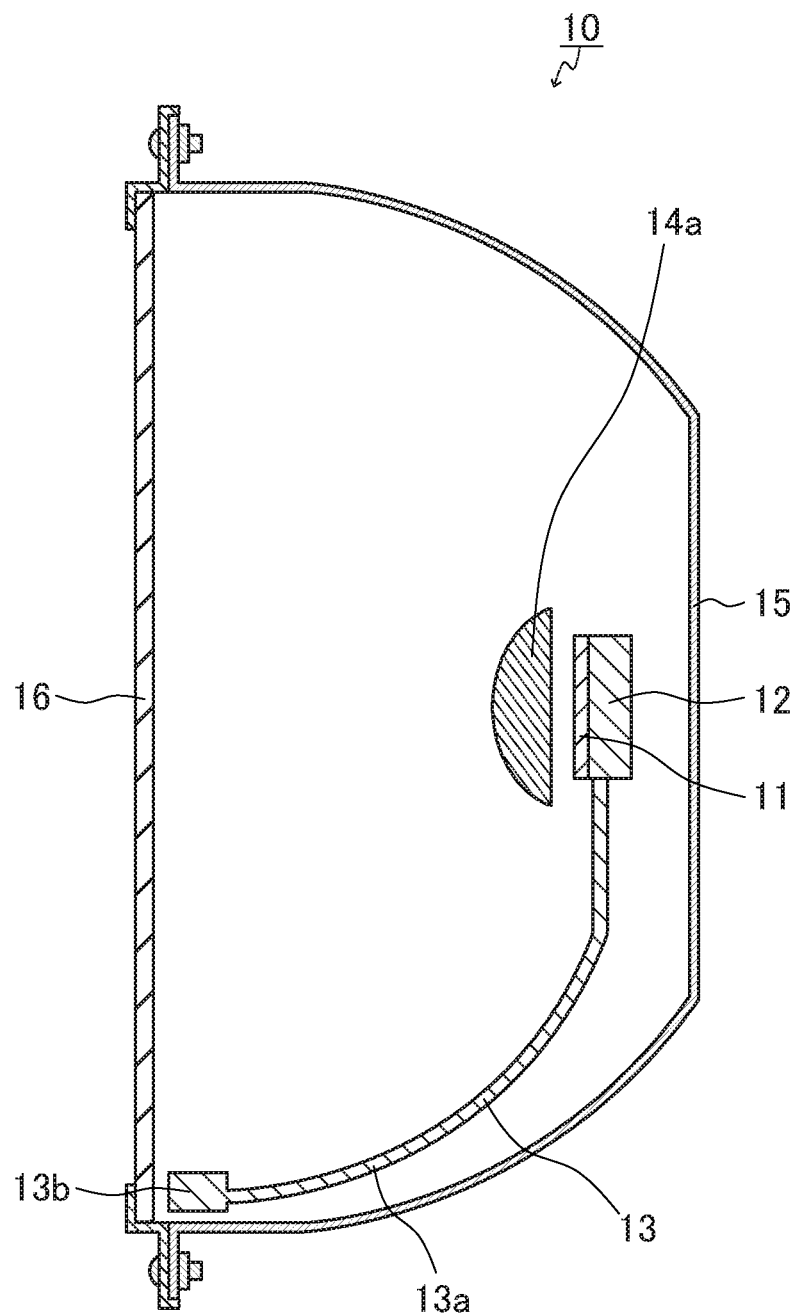
FIG. 5 is a cross-sectional view illustrating another example of the configuration of the lamp according to Embodiment 1.

The following will describe an arrangement example of the lamp 10 of the present embodiment with reference to FIGS. 3 and 4. The lamp 10 of the present embodiment may further include, for example, an arm 23 and a leg 21, and may be installed on the ground using the leg 21. Also, the lamp 10 of the present embodiment may include a cable 22 for supplying power to the LED module 11, for example. Furthermore, the lamp 10 shown in FIG. 3 may be mounted on a pole 31 installed on the ground, as shown in FIG. 4.

The lamp 10 of the present embodiment is configured so that it can blink 120 times a minute, for example. When installed at, for example, a large airport including a plurality of runways, about 8 to 29 lamps 10 of the present embodiment are arranged about every 30 meters from a position at which aircraft land toward an end of a runway. Furthermore, when installed at, for example, a small airport that includes only one short runway and at which a small number of aircraft land and take off, two lamps 10 of the present embodiment are arranged so as to flash (blink) at the same time, one lamp 10 being installed on each short directional end of the runway. Furthermore, when installed at, for example, an airport at which aircraft cannot enter a runway straight on, the lamps 10 of the present embodiment are arranged at important points located, for example, every several kilometers on an approach route to the runway. Furthermore, the lamp 10 of the present embodiment is configured such that its brightness can be switched between three levels according to, for example, criteria specified by the Ministry of Land, Infrastructure, Transport and Tourism. The three levels of brightness include: "High", which is the highest brightness and is used, for example, in the daytime when visibility is low due to fog, rain, or the like; "Low", which is the lowest brightness and is used, for example, at night; and "Middle", which is an intermediate brightness and is used, for example, in the evening or the like.

Embodiment 2

Figure 2A:
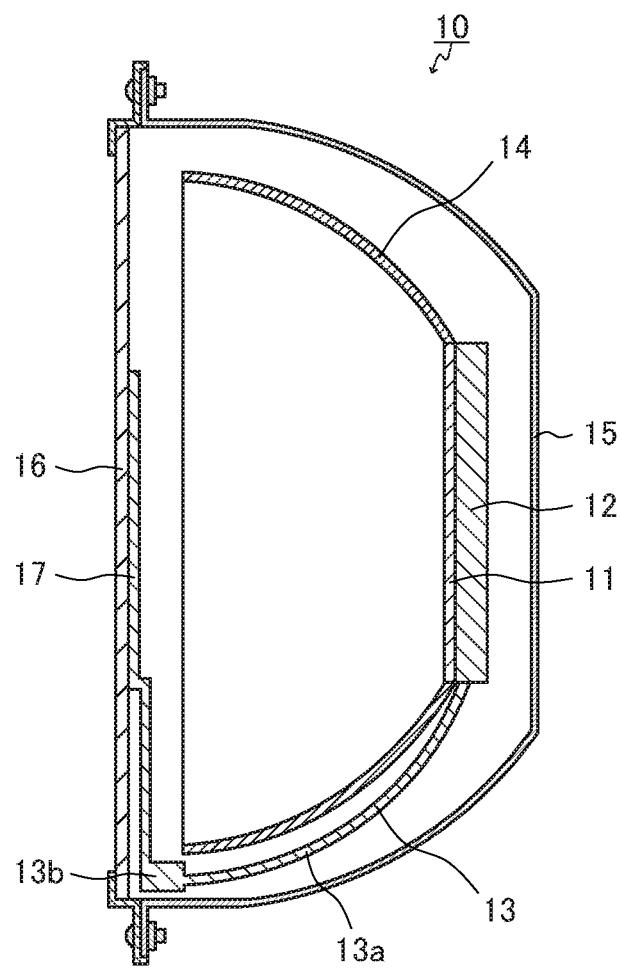
FIG. 2A is a cross-sectional view illustrating an example of a configuration of a lamp according to Embodiment 2.
Figure 2B:
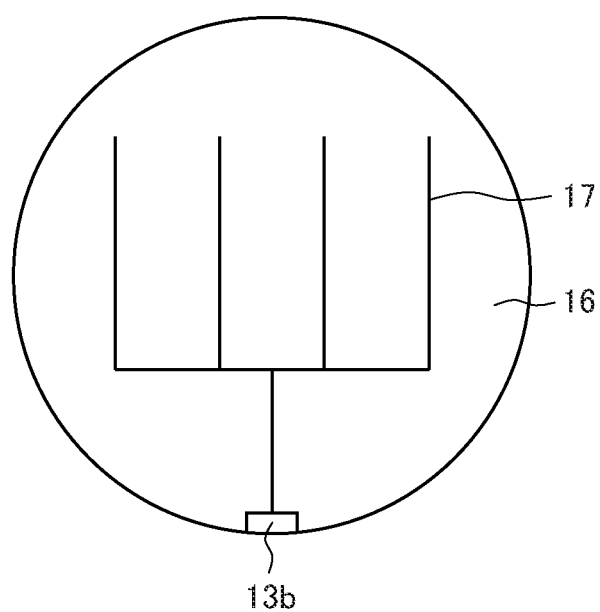
FIG. 2B is a diagram illustrating an arrangement example of a hot-wire heater of the lamp shown in FIG. 2A.

The present embodiment is another example of the lamp that is used in a flashing device for guiding landing of aircraft. FIGS. 2A and 2B show an example of a configuration of the lamp of the present embodiment. FIG. 2A is a cross-sectional view illustrating an example of the lamp of the present embodiment, and FIG. 2B is a diagram illustrating an arrangement example of a hot-wire heater of the lamp shown in FIG. 2A. As shown in FIGS. 2A and 2B, a lamp 10 of the present embodiment is the same as the lamp 10 of Embodiment 1 shown in FIG. 1 except that the light-transmissive cover 16 is provided with a hot-wire heater 17 thermally connected to the heat discharge section 13b.

The hot-wire heater 17 is preferably made of a thermally-conductive material (such as a nichrome wire, for example), and may also be made of a material that generates heat upon being supplied with power. In the latter case, when the light-transmissive cover 16 is made of electrically heated anti-fog glass, for example, the hot-wire heater 17 may be formed by printing a conductive paste made of silver or the like onto the inner surface of the light-transmissive cover 16. Furthermore, the hot-wire heater 17 is preferably arranged, without being particularly limited to, at least in a central portion of the light-transmissive cover 16 as shown in FIG. 2B, for example.

According to the lamp 10 of the present embodiment, since the light-transmissive cover 16 is provided with the hot-wire heater 17, it is possible to more effectively prevent snow from sticking to the light-transmissive cover 16 or snow melted thereon from freezing.

Embodiment 3

The present embodiment is an example of a lamp that is used in a traffic light. The lamp of the present embodiment is the same as the lamps 10 of Embodiments 1 and 2 shown in FIGS. 1 and 2A and 2B except that its brightness, size, and the like are suitably set for a signal lamp that is installed in a traffic light. Because LEDs are capable of continuously emitting light and blinking (flashing), and their emission color can freely be selected, the lamp of the present invention can be used, as appropriate, as a signal lamp installed in, for example, a cold weather region or the like.

The lamp of the present invention is applicable to, in addition to a flashing device for guiding landing of aircraft or a traffic light, various usages that require the prevention of snow from sticking thereto and snow melted thereon from freezing.

While the present invention has been described above with reference to the exemplary embodiments, the present invention is by no means limited thereto. Various changes and modifications that may become apparent to those skilled in the art may be made in the configuration and specifics of the present invention without departing from the scope of the present invention.

INDUSTRIAL APPLICABILITY

According to the present invention, it is possible to provide a lamp with an LED that can prevent snow from sticking thereto and snow melted thereon from freezing. The lamp of the present invention is applicable to various usages that require the prevention of snow from sticking thereto and snow melted thereon from freezing, such as for example a flashing device for guiding landing of aircraft, a traffic light, and the like.

EXPLANATION OF REFERENCE NUMERALS

10 Lamp
11 LED module
12 Heatsink
13 Heat transfer unit (heat pipe)
13a Heat conduction section
13b Heat discharge section
14 Light distribution unit (reflector)
14a Light distribution unit liens)
15 Housing
16 Light-transmissive cover
17 Hot-wire heater

The invention claimed is:

1. A lamp comprising:
   an LED module serving as a light source;
   a heatsink;
   a heat transfer unit;
   a light distribution unit;
   a housing with an opening; and
   a light-transmissive cover,
   wherein the LED module comprises a plurality of LEDs, and an LED substrate having a mounting surface on which the plurality of LEDs are mounted,
   wherein the heatsink is arranged on a side of the LED substrate opposite to the mounting surface,
   wherein the light distribution unit is arranged on a light emitting side of the LED module,
   wherein the LED module, the heatsink, and the light distribution unit are arranged in the housing,
   wherein the light-transmissive cover is arranged in the opening of the housing,
   wherein the heat transfer unit comprises a heat conduction section and a heat discharge section, the heat conduction section being arranged so as to conduct heat from the heatsink, the heat discharge section being arranged so as to be able to discharge the heat to the light-transmissive cover,
   wherein the heat discharge section of the heat transfer unit is arranged on a light-transmissive cover side, and one end of the heat conduction section of the heat transfer unit is thermally connected to the heatsink,
   wherein the light distribution unit comprises a reflector extended from the LED module towards the light-transmissive cover,
   wherein the heat conduction section is arranged between the reflector and the housing,
   wherein the heat discharge section is arranged between the reflector and the light-transmissive cover,
   wherein the heat discharge section is cantilevered away from the heat sink and towards the light-transmissive cover by the heat conduction section, and
   wherein the reflector comprises a reflecting surface subjected to high reflection processing.

2. The lamp according to claim 1,
   wherein the heat discharge section is arranged on a lower side of the lamp when it is installed.

3. The lamp according to claim 1,
   wherein the light-transmissive cover is provided with a hot-wire heater thermally connected to the heat discharge section.

4. The lamp according to claim 1,
   wherein the heat transfer unit comprises a heat pipe.

5. The lamp according to claim 1, wherein the reflector is tubular, and the LED module and the heatsink are arranged in an opening, on a light source side, of the reflector with the mounting surface directed toward an opening, on a light emitting side, of the reflector.

6. The lamp according to claim 1,
wherein the heat discharge section is formed at an end of the heat transfer unit, and
the other end of the heat transfer unit is thermally connected to the heatsink.

7. The lamp according to claim 1,
wherein the lamp is used in a flashing device for guiding landing of an aircraft.

8. The lamp according to claim 1,
wherein the heatsink has a plate-like shape.

9. The lamp according to claim 1,
wherein the reflector comprises a reflecting surface from the high reflection processing,
wherein the reflecting surface comprises at least one of a plating arranged on the reflector and a reflective paint, and
wherein the reflector comprises a tubular shape comprising a larger cross-section closer light transmissive cover than a cross-section closer to the LED module.

* * * * *